United States Patent
Klein (10) Patent No.: US 7,275,130 B2
(45) Date of Patent: Sep. 25, 2007

(54) METHOD AND SYSTEM FOR DYNAMICALLY OPERATING MEMORY IN A POWER-SAVING ERROR CORRECTING MODE

(75) Inventor: Dean A. Klein, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 10/886,063

(22) Filed: Jul. 6, 2004

(65) Prior Publication Data

US 2004/0243886 A1 Dec. 2, 2004

Related U.S. Application Data

(63) Continuation of application No. 10/119,550, filed on Apr. 9, 2002, now Pat. No. 6,838,331.

(51) Int. Cl.
*G06F 13/00* (2006.01)
(52) U.S. Cl. ..................... 711/105; 711/154; 711/166
(58) Field of Classification Search .............. 711/105, 711/154, 166
See application file for complete search history.

(56) References Cited

U.S. PATENT DOCUMENTS

| | | | | |
|---|---|---|---|---|
| 4,661,929 A | 4/1987 | Aoki et al. | ................. | 365/189 |
| 4,961,167 A | 10/1990 | Kumanoya et al. | .... | 365/189.09 |
| 5,134,699 A | 7/1992 | Aria et al. | ................. | 395/425 |
| 5,148,546 A | 9/1992 | Blodgett | ................. | 713/320 |
| 5,229,647 A | 7/1993 | Gnadinger | ................. | 257/785 |
| 5,321,662 A | 6/1994 | Ogawa | ................. | 365/191 |
| 5,381,368 A | 1/1995 | Morgan et al. | ........ | 365/189.01 |
| 5,414,861 A | 5/1995 | Horning | ................. | 395/750 |
| 5,475,645 A | 12/1995 | Wada | ................. | 365/222 |
| 5,598,422 A * | 1/1997 | Longwell et al. | ........... | 714/785 |
| 5,630,091 A | 5/1997 | Lin et al. | ................. | 395/437 |
| 5,712,795 A | 1/1998 | Layman et al. | ............ | 364/472 |
| 5,729,497 A | 3/1998 | Pawlowski | .................. | 365/200 |
| 5,764,562 A | 6/1998 | Hamamoto | ................ | 365/149 |

(Continued)

FOREIGN PATENT DOCUMENTS

WO    96/28225    9/1996

OTHER PUBLICATIONS

Stallings, William, "*Computer Organization & Architecture: Designing for Performing,*" pp. 103-116.

*Primary Examiner*—Reba I. Elmore
(74) *Attorney, Agent, or Firm*—Dorsey & Whitney LLP (57) ABSTRACT

A scrubbing controller used with a DRAM stores data in an error correcting code format. The system then uses a memory control state machine and associated timer to periodically cause the DRAM to read the error correcting codes. An ECC generator/checker in the scrubbing controller then detects any errors in the read error correcting codes, and generates corrected error correcting codes that are written to the DRAM. This scrubbing procedure, by reading error correcting codes from the DRAM, inherently refreshes memory cells in the DRAM. The error correcting codes are read at rate that may allow data errors to be generated, but these errors are corrected in the memory scrubbing procedure. However, the low rate at which the error correcting codes are read results in a substantial power saving compared to refreshing the memory cells at a higher rate needed to ensure that no data errors are generated.

15 Claims, 6 Drawing Sheets

U.S. PATENT DOCUMENTS

| | | | |
|---|---|---|---|
| 5,781,483 A | 7/1998 | Shore | 365/200 |
| 5,828,619 A | 10/1998 | Hirano et al. | 365/222 |
| 5,953,266 A | 9/1999 | Shore | 365/200 |
| 5,963,473 A | 10/1999 | Norman | 365/185.02 |
| 5,966,334 A | 10/1999 | Shore | 365/200 |
| 5,966,736 A | 10/1999 | Gittinger et al. | 711/207 |
| 5,974,573 A | 10/1999 | Martin | 714/48 |
| 5,978,952 A | 11/1999 | Hayek et al. | 714/764 |
| 5,982,697 A | 11/1999 | Williams et al. | 365/230.03 |
| 6,023,432 A | 2/2000 | Shore | 365/200 |
| 6,043,744 A * | 3/2000 | Matsudaira | 340/571 |
| 6,044,029 A | 3/2000 | Shore | 365/200 |
| 6,049,500 A | 4/2000 | Kajigaya et al. | 365/230.02 |
| 6,101,614 A | 8/2000 | Gonzales et al. | 714/6 |
| 6,104,641 A | 8/2000 | Itou | 365/149 |
| 6,134,167 A | 10/2000 | Atkinson | 365/222 |
| 6,154,851 A | 11/2000 | Sher et al. | 714/5 |
| 6,154,860 A | 11/2000 | Wright et al. | 714/718 |
| 6,191,995 B1 | 2/2001 | Huber et al. | 365/230.01 |
| 6,195,717 B1 | 2/2001 | Henderson et al. | 710/101 |
| 6,216,246 B1 | 4/2001 | Shau | 714/763 |
| 6,246,619 B1 | 6/2001 | Ematrudo et al. | 365/201 |
| 6,343,045 B2 | 1/2002 | Shau | 365/227 |
| 6,344,990 B1 | 2/2002 | Matsumiya et al. | 365/63 |
| 6,356,500 B1 | 3/2002 | Cloud et al. | 365/226 |
| 6,381,707 B1 | 4/2002 | Larsen et al. | 714/8 |
| 6,385,113 B1 * | 5/2002 | Longwell et al. | 365/222 |
| 6,414,894 B2 | 7/2002 | Ooishi et al. | 365/222 |
| 6,426,908 B1 | 7/2002 | Hidaka | 365/222 |
| 6,438,057 B1 | 8/2002 | Ruckerbauer | 365/222 |
| 6,438,068 B1 | 8/2002 | Roohparvar | 365/238.5 |
| 6,449,203 B1 | 9/2002 | Cowles et al. | 365/222 |
| 6,449,204 B1 | 9/2002 | Arimoto et al. | 365/222 |
| 6,452,859 B1 | 9/2002 | Shimano et al. | 365/230.06 |
| 6,510,528 B1 | 1/2003 | Freeman et al. | 714/6 |
| 6,519,201 B2 | 2/2003 | Cowles et al. | 365/222 |
| 6,528,974 B1 | 3/2003 | Mirov et al. | 323/267 |
| 6,532,180 B2 | 3/2003 | Ryan et al. | 365/195 |
| 6,549,476 B2 | 4/2003 | Pinney | 365/190 |
| 6,549,479 B2 | 4/2003 | Blodgett | 365/222 |
| 6,556,497 B2 | 4/2003 | Cowles et al. | 365/222 |
| 6,560,725 B1 * | 5/2003 | Longwell et al. | 714/54 |
| 6,580,149 B2 | 6/2003 | Tran et al. | 257/549 |
| 6,608,476 B1 | 8/2003 | Mirov et al. | 324/103 |
| 6,639,862 B2 | 10/2003 | Spirkl | 365/222 |
| 6,657,920 B2 | 12/2003 | Lee | 365/236 |
| 6,751,143 B2 | 6/2004 | Morgan et al. | 365/222 |
| 6,848,063 B2 * | 1/2005 | Rodeheffer et al. | 714/6 |
| 6,965,540 B2 | 11/2005 | Farrell et al. | 365/238.5 |
| 7,134,069 B1 * | 11/2006 | Longwell et al. | 714/800 |
| 2002/0126558 A1 | 9/2002 | Cowles et al. | 365/222 |
| 2002/0126559 A1 | 9/2002 | Cowles et al. | 365/222 |
| 2002/0162076 A1 | 10/2002 | Talagala et al. | 714/819 |
| 2003/0067830 A1 | 4/2003 | Leung et al. | 365/222 |
| 2003/0081492 A1 | 5/2003 | Farrell et al. | 365/238.5 |
| 2003/0097608 A1 | 5/2003 | Rodeheffer et al. | 714/7 |
| 2003/0161207 A1 | 8/2003 | Jones, Jr. et al. | 365/222 |
| 2006/0181947 A1 | 8/2006 | Morgan et al. | 365/222 |

* cited by examiner

METHOD AND SYSTEM FOR DYNAMICALLY OPERATING MEMORY IN A POWER-SAVING ERROR CORRECTING MODE

CROSS-REFERENCE TO RELATED APPLICATION

This application is a continuation of U.S. patent application Ser. No. 10/119,550, filed Apr. 9, 2002 now U.S. Pat. No. 6,838,331.

TECHNICAL FIELD

The invention relates to memory devices, and, more particularly, to a method and system for allowing a memory to operate in a manner that corrects data errors that may be generated by operating the memory in a mode that consumes relatively little power.

BACKGROUND OF THE INVENTION

Substantially all modern computers and other digital systems rely on semiconductor memory devices to store data and instructions for processing by a central processing unit (CPU). Most of these systems have a system memory, which usually consists of dynamic random access memory ("DRAM") devices. The memory storage cost/bit of DRAM devices is relatively low because a DRAM memory cell needs relatively few circuit components to store a data bit as compared with other types of memory cells, such as static random access memory ("SRAM") devices. Thus, a high capacity system memory can be implemented using DRAM devices for a relatively low cost.

Although DRAM devices have the advantage of providing relatively low-cost data storage, they also have the disadvantage of significantly consuming power, In fact, DRAM devices used in a digital system, such as a computer, can consume a significant percentage of the total power consumed by the system. The power consumed by computers and other digital systems can be a critical factor in their utility in certain applications. For example, the power consumed by portable personal computers greatly affects the length of time they can be used without the need to recharge batteries powering such computers. Power consumption can also be important even where memory devices are not powered by batteries because it may be necessary to limit the heat generated by the memory devices.

One operation that tends to consume power at a substantial rate is refreshing memory cells in a DRAM device. As is well-known in the art, DRAM memory cells, each of which essentially consists of a capacitor, must be periodically refreshed to retain data stored in the DRAM device. Refresh is typically performed by activating each row of memory cells in an array, which essentially reads data bits from the memory cells in each row and then internally writes those same data bits back to the same cells in the row. This refresh is generally performed at a rate needed to keep charge stored in the memory cells from leaking excessively between refreshes. Since refresh involves accessing data bits in a large number of memory cells at a rapid rate, refresh tends to be a particularly power-hungry operation. Thus many attempts to reduce power consumption in DRAM devices have focused on reducing the rate at which power is consumed during refresh.

The amount of power consumed by refresh also depends on which of several refresh modes is active. A self-refresh mode is normally active during periods when data are not being read from or written to the DRAM device. Since many electronic devices, such as notebook computers, are often inactive for substantial periods of time, the amount of power consumed during self-refresh can be an important factor in determining how long the electronic device can be used after a battery charge. While power is also consumed at a significant rate during other refresh modes when the DRAM device is active, the DRAM device is consuming power at a significant rate anyway while the data stored therein are being accessed. Therefore, if the power consumption during self-refresh can be reduced, the rate of power consumption during refresh can be significantly reduced.

One technique that has been used to reduce the amount of power consumed by refreshing DRAM memory cells varies the refresh rate as a function of temperature. As is well known in the art, the rate at which charge leaks from a DRAM memory cell increases with temperature. The refresh rate must be sufficiently high to ensure that no data is lost at the highest temperature in the specified range of operating temperatures of the DRAM device. Yet, DRAM devices normally operate at temperatures that are substantially lower than their maximum operating temperature. Therefore, DRAM devices are generally refreshed at a rate that is higher than the rate actually need to prevent data from being lost, and, in doing so, unnecessarily consume power. To address this problem, some commercially available DRAM devices allow the user to program a mode register to select a lower maximum operating temperature. The DRAM device then adjusts the refresh rate to correspond to the maximum operating temperature selected by the user. Although adjusting the refresh rate to correspond to a lower maximum operating temperature does reduce the rate of power consumed during refresh, it nevertheless still allows power to be consumed at a significant rate. If the refresh rate was reduced beyond a safe limit, at least some of the memory cells might not be refreshed before that data stored therein was lost. Data subsequently read from the DRAM device would then contain erroneous data bits.

There is therefore a need for a method and system that reduces the power consumed by a DRAM device during refresh in at least some operating modes without risking a loss of data stored in the DRAM device.

SUMMARY OF THE INVENTION

A method and system for storing data in a dynamic random access memory ("DRAM") device in either a normal operating mode when the DRAM device is active or a power-saving mode when the DRAM device is inactive. In the normal operating mode, data may be read from or written to the DRAM device, and memory cells in the DRAM device are refreshed at a first rate that is sufficiently high to prevent any data errors from being generated. In the power-saving mode, the memory cells in the DRAM device are scrubbed at a second rate that is substantially less than the first rate. The second rate may be sufficiently low that data errors are generated, but error correction techniques used in the memory scrubbing procedure correct any errors that are generated. The relatively low scrubbing rate inherently refreshes the memory cells at a sufficiently low rate that substantially less power is consumed compared to refresh in the normal operating mode.

DETAILED DESCRIPTION OF THE INVENTION

Figure 1:
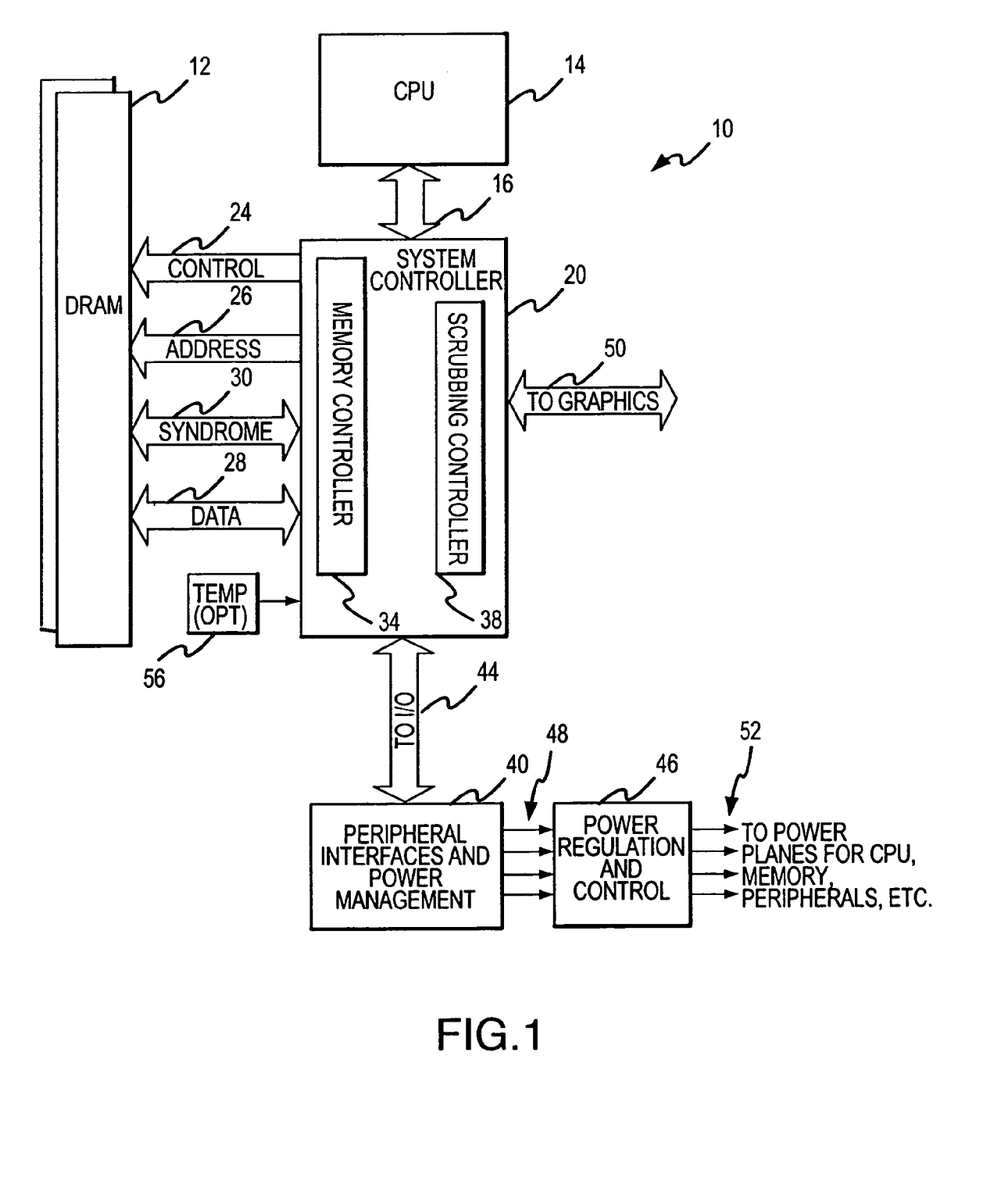
FIG. 1 is a block diagram of a computer system according to an embodiment of the invention.

One embodiment of a computer system 10 containing a DRAM device 12 that uses relatively little refresh power in at least some operating modes is shown in FIG. 1. The computer system 10 includes a central processing unit ("CPU") 14 for performing various computing functions, such as executing software to perform specific calculations or tasks. The CPU 14 includes a processor bus 16 that normally includes an address bus, a control bus, and a data bus. The CPU 14 is also coupled through a system controller 20 to system memory implemented using the DRAM device 12. The system controller 20 includes a control bus 24, an address bus 26 and a data bus 28, all of which are coupled to the DRAM device 12 in a conventional manner. However, the system controller 20 also includes an additional data bus, which will be referred to as a check bit bus 30. The system controller 20 also includes a memory controller 34 for controlling the operation of the DRAM device 12 and a scrubbing controller 38, the function of which will be explained below.

The computer system 10 also includes a conventional Peripheral Interface and Power Management Module 40 coupled to the system controller 20 through a peripheral bus 44. The Peripheral Interface and Power Management Module 40 is coupled to a conventional Power Regulation and Control circuit 46 thorough signals lines 48. The system controller 20 may also be coupled to a video device (not shown) through a graphics bus 50.

As is well known in the art, the Peripheral Interface and Power Management Module 40 couples the CPU 14 through the system controller 20 to various peripheral devices (not shown), including an input device such as a keyboard or a mouse, an output device such as a printer, and a data storage device such as a hard disk or a floppy disk. The Peripheral Interface and Power Management Module 40 also couples the CPU 14 to the Power Regulation and Control circuit 46, The Power Regulation and Control circuit 46 generates various signals on respective signals lines 52 for controlling the power consumed by the computer system 10.

As explained in greater detail below, the DRAM device 12 uses the scrubbing controller 38 to operate in either of two modes. When the DRAM device 12 is active, it operates in a normal mode in which it refreshes the memory cells in an array either periodically or in response to refresh commands. In this normal mode, the DRAM device 12 consumes a relatively large amount of power. When the DRAM device 12 is inactive, it operates in a power-saving mode in which it essentially refreshes the DRAM memory cells at a rate that is sufficiently low that data bits may be lost from memory cells in the array. However, in this power-saving mode, the DRAM device 12 performs a "memory scrubbing" process in which data are stored in the DRAM device 12 in a conventional error correcting code ("ECC") format. The data are then periodically read from the DRAM device 12, and, if any errors have developed, corrected data are written to the DRAM device 12 in ECC format. More specifically, when transitioning to the power-saving mode, the data are read from the DRAM device 12, and check bits are derived from the read data in a conventional manner. As is known in the art, the number of check bits generated will depend on the number of data bits, the number of errors that are to be correctable, and whether an additional bit will be used to detect an additional error that cannot be corrected. The check bits and data bits, which together constitute an ECC, are then stored in the DRAM device 12.

Thereafter, in the memory scrubbing procedure, the ECC is read from the DRAM device 12, and check bits are derived from the data portion of the read ECC in the same manner that the check bits stored in the DRAM device 12 were derived. The derived check bits are then compared to the check bits in the read ECC to generate a syndrome. The syndrome indicates whether any of the bits of the read ECC are in error, and, if so, the location of the bit error(s). The information provided by the syndrome is used to correct the bit(s), and a corrected ECC is then written to the DRAM device 12 device. By periodically correcting "soft" errors in the DRAM device, the memory cells in the DRAM device 12 can be refreshed at a rate that is sufficiently low that may allow some data storage errors to be developed, thereby substantially reducing the power consumption of the DRAM device 12.

The memory scrubbing process inherently refreshes the memory cells because it requires that data be read from the memory array. However, the rate at which the memory scrubbing occurs can be relatively low since any errors that are created by the low refresh rate can be corrected. As a result, the power consumption of the DRAM device 12 is substantially reduced during refresh.

The above-described error correcting procedure is performed using conventional algorithms that have been used in memory devices where refresh occurs at the normal rate but absolute reliability of data storage is required. Conventional DRAM devices have used ECC even though the error rate of DRAM devices is relatively small, since data errors can occur even when there are no "hard" errors resulting from inoperative memory cells. Such "soft" errors can be caused by, for example, stray alpha particles, power supply fluctuations, noise, or by a variety of other conditions. Typical approaches to checking and correcting memory errors rely upon some form of error correction code that are typically generated by a mathematical algorithm that is applied to the data to be checked and corrected. Any of these conventional error correcting processes may be used in the memory scrubbing process.

The system may also include a temperature sensor 56 for use by some embodiments of the invention to control the scrub rate during the power-saving mode. As is known in the art, the rate at which charge leaks from DRAM memory cells increases with temperature. By using the temperature sensor 56, the rate at which the scrubbing process is performed can be increased with increasing ambient temperature and decreased with decreasing ambient temperature to provide optimum power saving without permitting excessive data errors.

Figure 2:
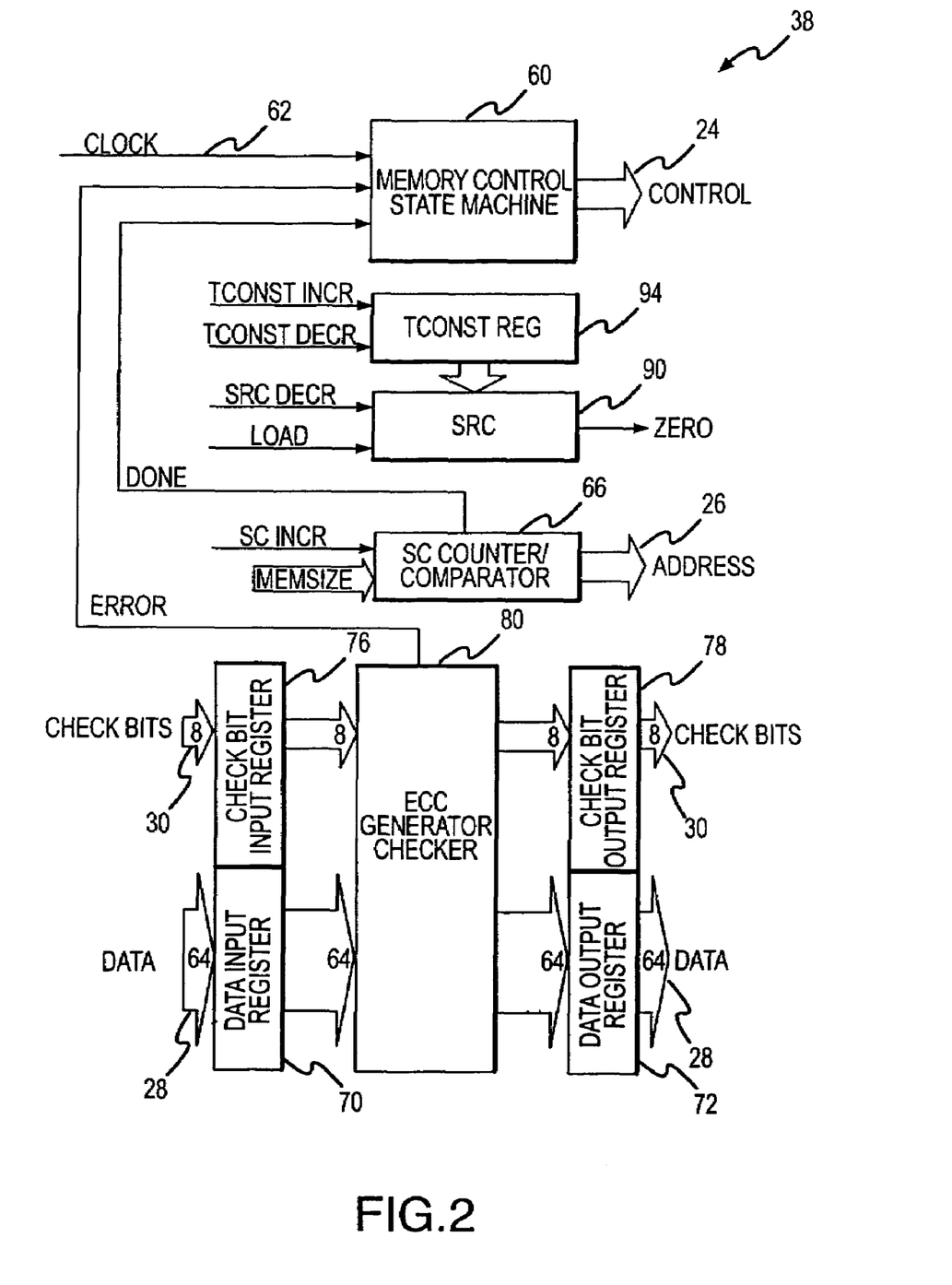
FIG. 2 is a block diagram of a scrubbing controller used in the computer system of FIG. 1.

One embodiment of the scrubbing controller 38 is shown in FIG. 2. The scrubbing controller 38 includes a Memory Control State Machine 60 that is coupled to the control bus 24 of the DRAM device 12 (FIG. 1). The Memory Control State Machine 60 receives a periodic clock signal on the line 62 as well as "Done" and "Error" control signals from components that will be described. The State Machine generates conventional signals for controlling the operation of the DRAM device 12 to read data from and write data to the DRAM device 12.

The location in the DRAM device 12 from which the data are read and to which the data are written responsive to these control signals is determined by an address generated by an SC Counter/Comparator 66 that is coupled to the DRAM device 12 through the address bus 26. The SC counter/comparator 66 receives data "MemSize" indicative of the data capacity of the DRAM device 12 from another component in the computer system 10, such as the CPU 14 (FIG. 1). The address generated by the SC Counter/Comparator 66 is incremented by an SC Incr pulse that is also generated by another component in the computer system 10, such as the CPU 14.

The data bus 28 of the DRAM device 12 is coupled to an input of a data input register 70 and to an output from a data output register 72. Similarly, the check bit bus 30 is coupled to an input of a check bit input register 76 and to an output from a check bit output register 78. Outputs from the data input register 78 and the check bit input register 76 are coupled to inputs of an ECC Generator Checker 80, and outputs from the ECC Generator Checker 80 are applied to inputs of the check bit output register 78 and the data output register 72.

In operation, after the start of a memory scrubbing procedure, the state machine 60 generates control signals, and the SC Counter/Comparator 66 generates an address, to read data and an associated check bits from the DRAM device 12. The data and check bits are coupled through input registers 70, 76, respectively, to the ECC Generator Checker 80, which performs a conventional ECC algorithm to determine if there are any errors in the data or check bits. If so, the ECC Generator Checker 80 generates corrected data and/or check bits in a conventional manner, which are coupled through output register 72, 78, respectively, for storage in the DRAM device 12. When the ECC Generator Checker 80 detects an error, it generates an "Error" signal that is applied to the Memory Control State Machine 60. In response, the State Machine 60 generates appropriate control signals to cause the DRAM device 12 to store the corrected data and check bits, preferably at the same location from which the data and check bits were read. The SC Counter/Comparator 66 is then incremented to cause the data and check bits stored at the next memory location to be analyzed. This process is repeated until the data and check bits stored in all memory locations have been analyzed and, if necessary, corrected. The SC Counter/Comparator 66 then generates a "Done" signal, which is applied to the Memory Control State Machine 60 so that the State Machine 38 can terminate the memory scrubbing process.

After the memory scrubbing process has been completed, the scrubbing controller 38 remains inactive until the scrubbing process is to be repeated. For this purpose, a scrub refresh counter ("SRC") 90 is loaded with a time constant "Tconst" from a Tconst Register 94 at the end of the prior scrubbing process responsive to a "Load" pulse applied to the SRC 90. The SRC 90 is then periodically decremented by successive SRC Decr pulses generated by another component in the computer system 10, such as the CPU 14.

When the count of the SRC 90 reaches zero, the SRC 90 generates a "Zero" pulse, which indicates that the time period from the prior scrubbing procedure has lapsed and a new scrubbing procedure must be performed. The "Zero" pulse may be applied to, for example, an interrupt port the CPU 14 to allow the CPU 14 to initiate the memory scrubbing procedure.

In one embodiment of the invention, the value of the time constant Tconst may be incremented responsive to Tconst Incr pulses applied to the register 94 and decremented responsive to Tconst Decr pulses applied to the register 94. As a result, the value of the time constant Tconst may be adapted to operational parameters, such as the number of errors found during the scrubbing process or the temperature of the DRAM device 12.

The operation of the computer system 10 using the scrubbing controller 38 according to one embodiment of the invention will now be explained with reference to the flow chart shown in FIG. 3. The process is entered at step 100 and proceeds to step 102 wherein the SC Counter/Comparator 66 (FIG. 2) is reset and an Error Flag is set "False." The "Load" pulse is then generated at step 104 to load the time constant Tconst stored in the register 94 into the SRC 90. The process then remains in a loop in which the count in the SRC 90 is periodically decremented at step 108 and the value of the count in the SRC 90 is checked at 110. When the count has reached zero, the SRC 90 generates the "Zero" signal, and the memory scrubbing process begins.

As explained above, the State Machine 60 generates appropriate control signals to read data and the associated check bits from a memory location at step 114. The ECC Generator Checker 80 then generates check bits in a conventional manner from the read data at step 118. A syndrome is generated at step 120 by comparing the generated check bits to the check bits read from memory, and a determination is made from the Syndrome whether the read ECC is correct. The syndrome may indicate that no errors exist in the data or check bits of the ECC read from the DRAM device 12. If, however, the syndrome indicates that an error exists in the read data or check bits, the ECC Generator Checker corrects the read data and/or check bits, and the State Machine 60 generates appropriate control signals at step 124 to write the corrected data and/or check bits to the DRAM device 12 at step 124, as previously explained. An ErrorFlag is then set True at step 128.

After data and the associated check bits are read from the DRAM device 12 and, if necessary, corrected data and check bits are stored in the DRAM device 12, the scrub count value SC indicative of the current memory location is incremented at step 130. The incremented value SC is then compared to the capacity of the DRAM device 12 at step 134 to determine if all of the memory locations in the DRAM device 12 have been scrubbed. The capacity of the DRAM device 12 is indicated by the MemSize data applied to the SC Counter/Comparator 66, as previously explained. If all of the memory locations have not been scrubbed, the process returns to step 114 to scrub the next memory location in the DRAM device 12. If all the memory locations have been scrubbed, a check is made at step 138 to determine if the DRAM device 12 has been transitioned out of the inactive, power-saving mode. If so, the process exits at 140. Otherwise, the process returns to step 102 to wait until the next scrubbing process should be initiated, as previously explained.

The value of the time constant Tconst stored in the register 94 (FIG. 2) may be a value that does not change under any circumstances. However, as previously mentioned, the value of the time constant Tconst may alternatively be adapted to the operation of the DRAM device 12. For example, a time constant adjusting process 150 shown at FIG. 4 may be used to vary the rate at which the scrubbing procedure is initiated to permit a desired level of memory errors. The process 150 may be performed just upstream from the "Continue Scrubbing?" step 138 shown in FIG. 3. Accordingly, the Error Flag is checked at 152 after a determination was made at step 134 (FIG. 3) that the entire memory array had been scrubbed. It will be recalled that the Error Flag was reset False at step 102 and, in the event a memory error was detected at step 120, was set True at step 128. Thus, if any memory error was detected during the scrubbing process, the Error Flag will be True, thereby causing the time constant Tconst to be decremented at step 154. The reduced value of the time constant Tconst will cause a reduction in the time delay until the next memory scrubbing procedure is performed. The process then proceeds to step 138 to determine if memory scrubbing should continue, as previously explained.

Figure 4:
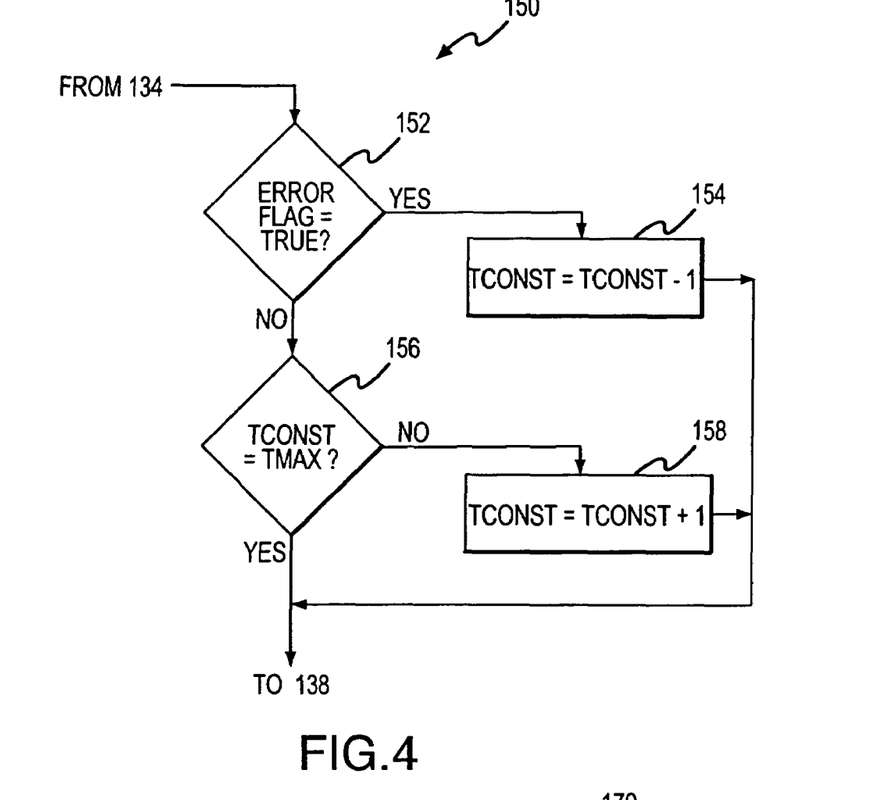
FIG. 4 is a flow chart showing the manner of setting a scrub rate according to one embodiment of the invention.

If no memory error is detected at 152, a determination is made at 156 whether the maximum value of the time constant has been reached. If not, the time constant Tconst is incremented at 158 before a determination is made at 138 whether memory scrubbing should continue. If the maximum value of the time constant has been reached, the process reaches step 138 without any increase in the value of the time constant. If the time constant adjusting process 150 shown in FIG. 4 is not used, then the step 102 of setting the Error Flag False and the step 128 of setting the Error Flag True may be eliminated.

The time constant adjusting process 150 adjust the value of the time constant Tconst so that the number of memory errors detected and corrected each scrubbing procedure will generally be either zero or one error. However, the process 150 can be easily adapted to set the time constant Tconst so that any desired number of errors within the error correcting capability of the ECC Generator Checker 80 will be detected and corrected. For example, instead of setting a Error Flag True responsive to detecting an error, the count of a counter could be incremented each time an error was detected. Instead of checking the state of the Error Flag at step 152, the count of the counter would then the compared to a value corresponding to the desired number of errors to determine if the time constant should be incremented or decremented. Other variations will be apparent to one skilled in the art.

Figure 5:
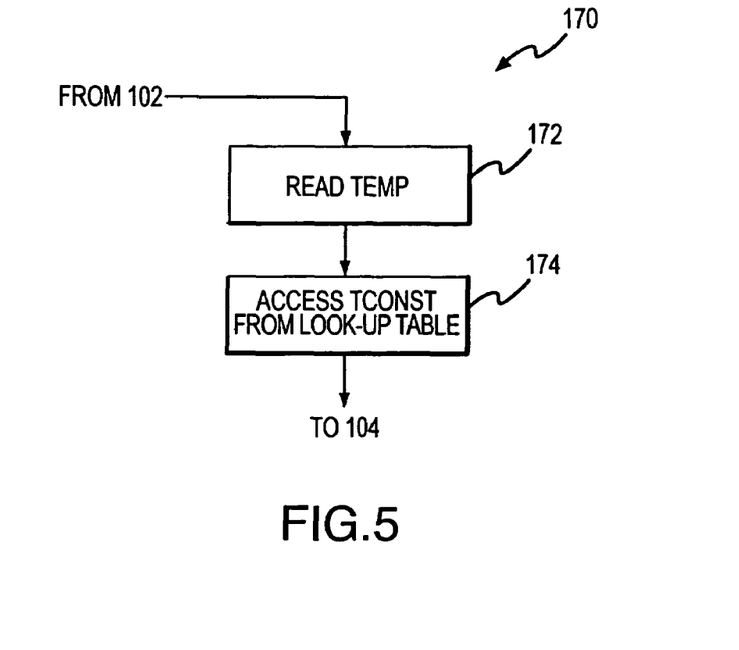
FIG. 5 is a flow chart showing the manner of setting a scrub rate according to another embodiment of the invention.

The value of the time constant Tconst may be adapted to operating conditions other than the number of memory errors. For example, as previously mentioned, the frequency at which the scrubbing procedure is performed may be adjusted as a function of the temperature of the DRAM device 12. The initial value of the time constant Tconst may be adjusted as a function of temperature using the procedure 170 shown in FIG. 5. The procedure 170 is entered from the "Reset Scrub Counter (SC)" step 102 and exits to the "SRC=0?" step at 110. The temperature is read from the temperature sensor 56 (FIG. 1) at step 172. A lookup table is then accessed at step 174 to determine a time constant Tconst corresponding to the measure temperature. Smaller values for the time constant Tconst correspond to hotter temperatures because charge leaks from DRAM memory cells a faster rate with higher temperatures of the DRAM device 12, thus requiring more frequent memory scrubbing to refresh the memory cells. Thereafter, the time constant Tconst can be adjusted from the value initially set as a function of temperature using a suitable procedure, such as the procedure 150 shown in FIG. 4. If the procedure 170 shown in FIG. 5 is not used, the temperature sensor 56 may, of course, be eliminated.

Figure 3:
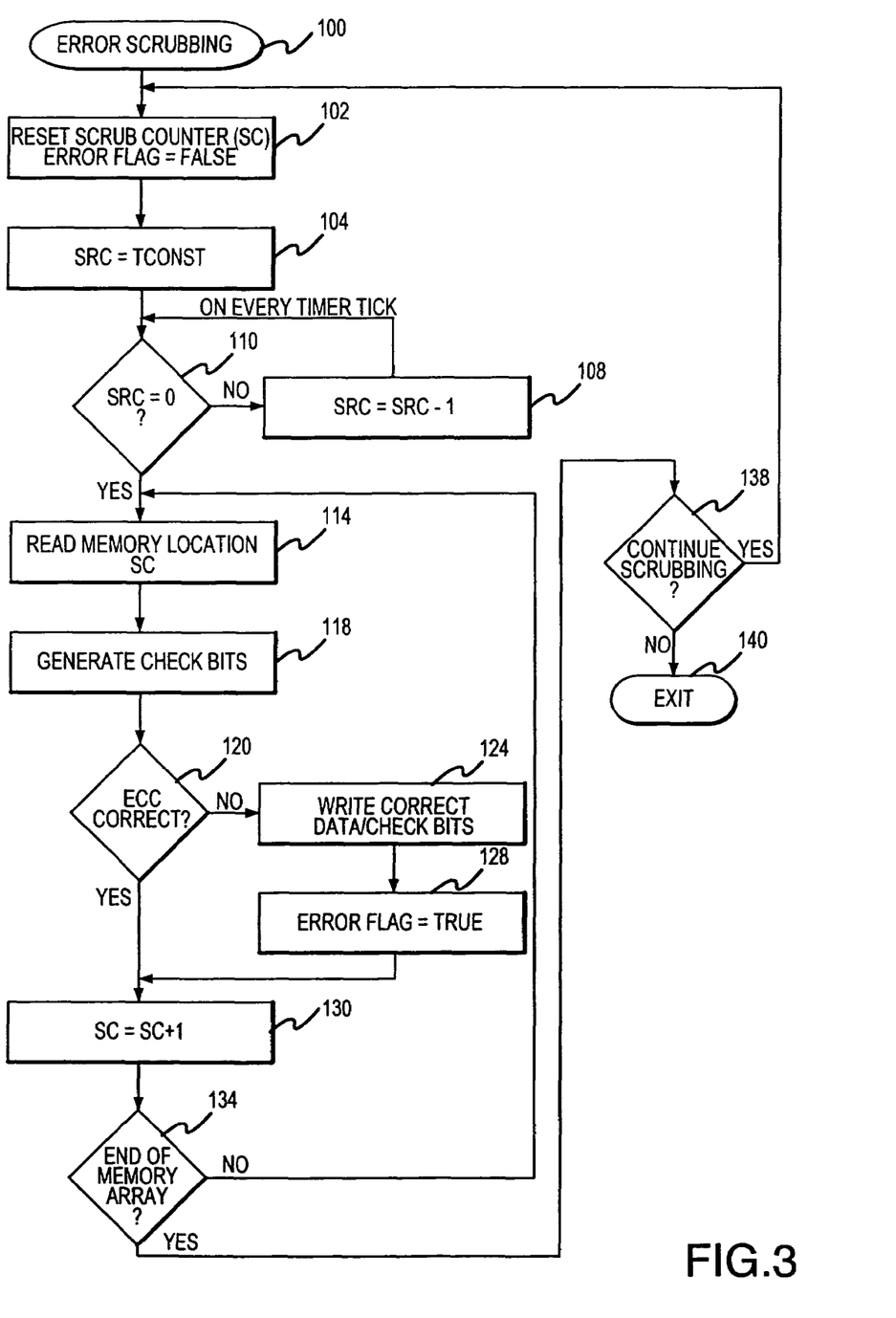
FIG. 3 is a flow chart showing the operation of a computer system using a scrubbing controller according to one embodiment of the invention.
Figure 6:
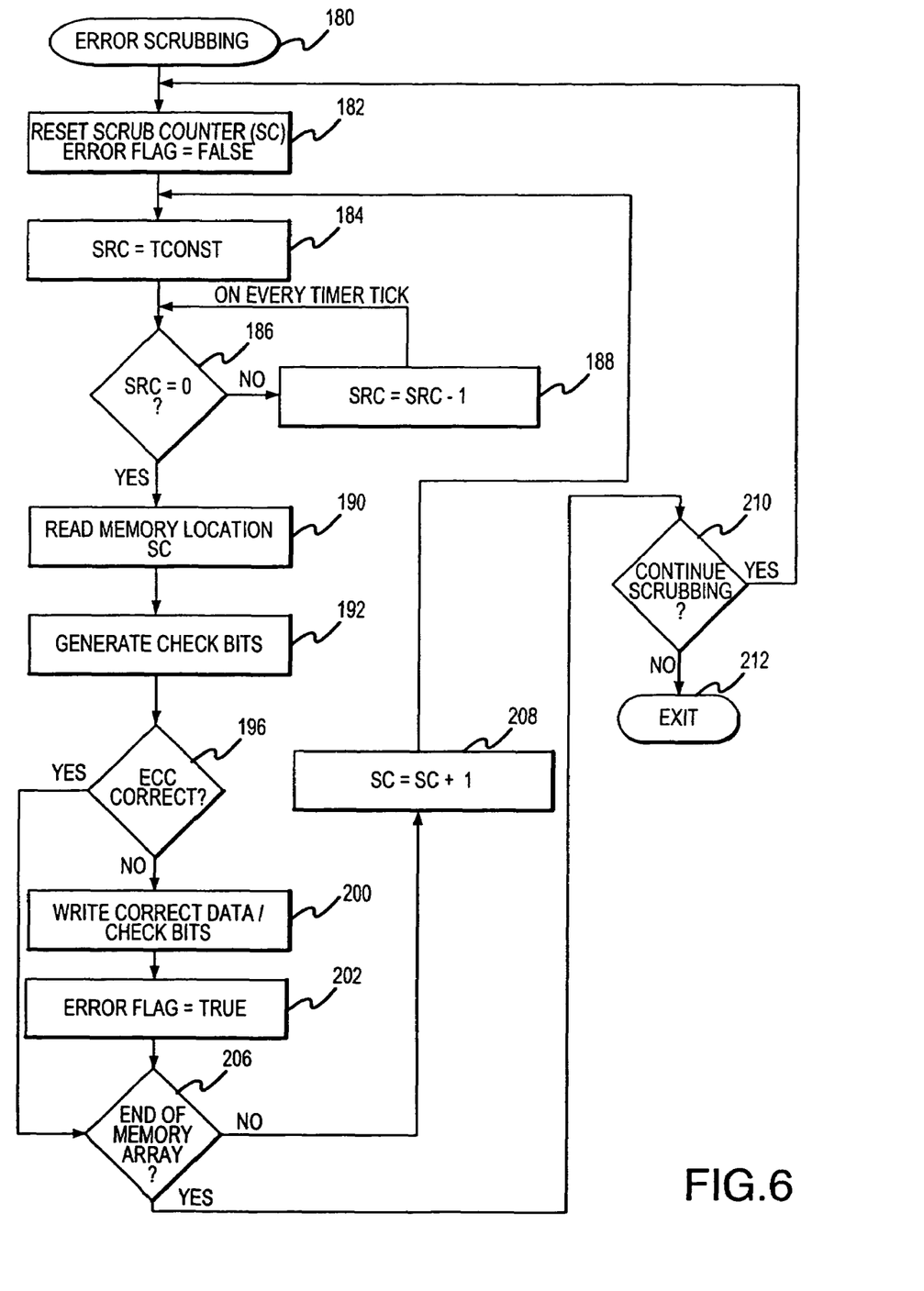
FIG. 6 is a flow chart showing the operation of a computer system using a scrubbing controller according to another embodiment of the invention.

To the scrubbing procedure shown in FIG. 3 periodically performs a scrubbing procedure and then scrubs all that the memory cells during that procedure. Alternatively, memory scrubbing may be performed in a continuous procedure in which there is a time delay between the scrubbing of memory cells in each location of the DRAM device 12. A scrubbing procedure having these characteristics is shown in FIG. 6. The procedure is entered at 180, and the count of the SC Counter/comparator 66 (FIG. 2) is reset and an Error Flag is set False at step 182. The time constant Tconst stored in the register 94 is then loaded into the SRC 90 at step 184. The procedure then it remains in a loop in which the count of the SRC 90 is checked at step 186 to determine if the count has been decremented to zero. If not, the count is decremented by one at step 188 until the zero count is reached. A single location in the DRAM device 12 is then scrubbed.

The single location is scrubbed by first reading date and an associated check bits from the DRAM device 12 at step 190. The ECC Generator Checker 80 generates check bits corresponding to the read data at step 192. The generated check bits and the read check bits are then processed to generate a syndrome at step 196. If the syndrome indicates there are errors in the read data and/or check bits, the ECC Generator Checker 80 uses the information provided by the syndrome to correct the erroneous data and/or check bits. The corrected data and check bits are then written to the DRAM device 12 at step 200. The Error Flag is also set True at step 202. A determination is then made at step 206 as to whether the end of the memory array has been reached. Also, if the syndrome indicates at step 196 that no errors are detected, the procedure jumps to step 206 without writing corrected data and/or check bits at step 200 or setting the Error Flag True at step 202.

If the last memory location in the DRAM device 12 has not been reached, the SC count in the SC Counter/Comparator 90 is incremented at step 208 before returning to reset the time constant Tconst at step 184. The procedure then waits in the loop 186, 188 before scrubbing the next location in memory, as previously explained. If a determination is made at step 206 that the entire memory array has been scrubbed, a determination is made at 210 if scrubbing is to continue. If so, the procedure returns to step 182 to reset the count of the SC Counter/Comparator 66 to the first memory location and to set the Error Flag False at step 182. If a determination is made at step 210 that memory scrubbing will terminate, the procedure exits at 212.

The presence of the Error Flag presumes, of course, that the time constant adjusting procedure 150 shown in FIG. 4 is used between step 206 and step 210. If the time constant Tconst does not change or another time constant adjusting procedure, such as the temperature adjusting procedure 170 shown in FIG. 5, is used, the Error Flag would not be used.

The advantage of the scrubbing procedure shown in FIG. 6 is that it provides the lowest peak power by spreading the memory scrubbing out over a longer duration. This procedure could also be used even if the DRAM device 12 was not operated in an inactive power-saving mode by integrating the procedure into any standard error scrubbing system.

FIGS. 3-6 illustrate the memory scrubbing procedures during the power saving mode when the DRAM device 12 is inactive. They do not show the procedure is that would be required for transitioning into and out of the power saving mode. However, when transitioning into the power saving mode, the scrubbing procedure shown in FIGS. 3 and 6 may be used with some slight modifications that will be apparent to one skilled in the art. For example, the time constant Tconst will initially be set to a minimum value corresponding to the normal refresh rate since the data will not yet have been stored in the DRAM device 12 in error correcting mode. Also, since the data will not be saved in ECC format, data will be read from the DRAM device 12 at step 114 or 190, check bits will be generated at step 118 or 192, and the data and check bits will be written to the DRAM device 12 at step 124 or 200. Thereafter, the time constant Tconst may be set to a value that will provide memory scrubbing at a relatively low rate.

Although the check bits are shown in FIG. 2 as being coupled to and from the DRAM device 12 through a check bit bus 30 that is separate from the data bus 28, it will be understood that the check bits and data bits may be combined in a predetermined manner in the ECC Generator Checker to form an ECC containing both the data and check bits. The ECC can then be coupled to and from the DRAM device 12 through a single bus (not shown) for storage in the DRAM device 12. However, storing the data in the DRAM device 12 separately from the check bits is preferred because it may then not necessary to alter the manner in which the data are stored when transitioning into and out of the power-saving mode in which memory scrubbing occurs. After transitioning from the power-saving mode to the normal operating mode, the normal refresh logic, as well as external refresh commands, will ensure that the memory cells in the DRAM device 12 are refreshed at an adequate rate.

Although FIG. 1 shows the check bits being stored in the same DRAM device 12 that the data are stored, it will be understood that the data and check bits can be stored in different DRAM devices, or they can be stored in the same DRAM device 12 but in different arrays or areas of the same array.

Figure 7:
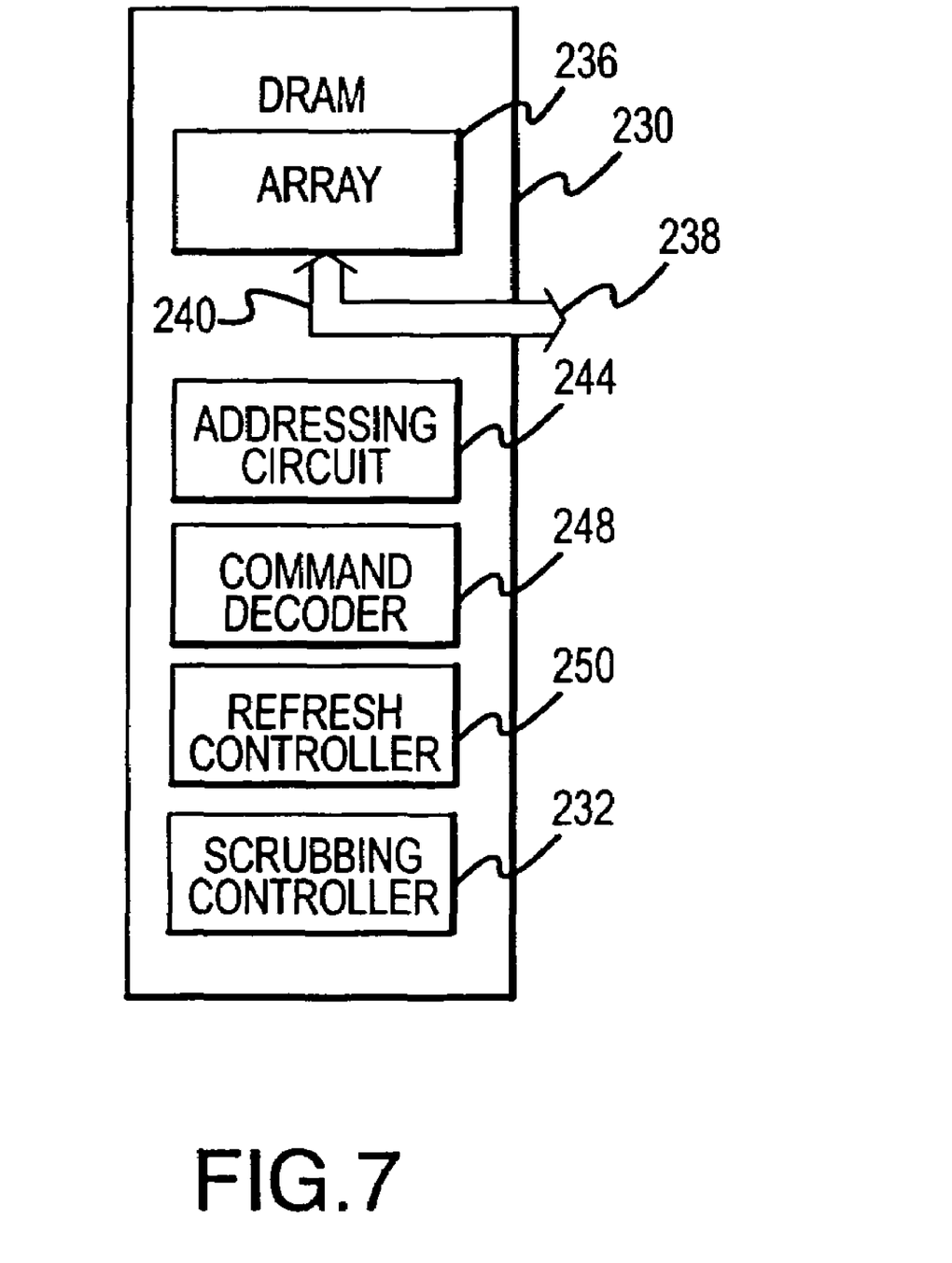
FIG. 7 is a block diagram of a DRAM device containing a scrubbing controller according to one embodiment of the invention.

Another embodiment of the invention is shown in FIG. 7 in which a DRAM 230 device of conventional design includes an internal scrubbing controller 232. The DRAM device 230 also includes an array 236 of memory cells arranged in rows and columns that are accessed to write data to and read data from the DRAM device 230. The data are coupled between the array 236 and a data bus 238 through a data path 240. The locations of the memory cells in the array 236 that are accessed for a read or a write operation are designated by an externally applied memory address that is received and decoded by an addressing circuit 244 of conventional design. The operation of the DRAM device 230 is determined by control signals generated by a command decoder 248 responsive to externally applied memory commands that are received and decoded by the command decoder 248. The DRAM device 230 also includes a refresh controller 250 that causes rows of memory cells in the array 236 to be refreshed responsive to either externally applied memory commands or internally generated signals.

The command decoder 248 causes the DRAM device 230 to operate in either of two modes. In a normal operating mode, the DRAM device 230 is active and able to write data to or read data from the array 236. During this operating mode, the refresh controller 250 refreshes the memory cells in the array 236 at a rate that is sufficiently high to ensure that no data errors are generated in the array 236. In a power-saving mode, the scrubbing controller 232 causes the memory cells in the array 236 to be scrubbed, as previously explained.

Although the scrubbing controller 232 may be substantially as shown in FIG. 2, if my also have other configurations. For example, the scrubbing controller 232 may use various components that are normally in DRAM devices, such as the addressing circuit 244 or the refresh controller 250, to perform some of the functions performed by various components in the scrubbing controller 38 of FIG. 2. Also, the functions of a control state machine for the scrubbing controller 232 may simply be performed by the command decoder 248. Therefore, the scrubbing controller 232 may not include some of the components shown in FIG. 2, and it may also include additional components. By using a scrubbing controller 232 that is internal to the DRAM device 230, the DRAM device 230 may be included in a conventional electronic system (not shown), such as a computer system, without specially modifying the electronic system to provide memory scrubbing in a power-saving mode. A scrubbing controller may also be included in locations other than the system controller 20 shown in FIG. 2 or the DRAM device 230 shown in FIG. 7.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of storing data in a dynamic random access memory ("DRAM") device in either a normal operating mode when the DRAM device is active or a power-saving mode when the DRAM is inactive, the method comprising:
    in the normal operating mode, refreshing memory cells in the DRAM device at a first rate, the memory cells being refreshed without being scrubbed in the normal operating mode; and
    in the power-saving mode, scrubbing the memory cells in the DRAM device at a second rate that is substantially less than the first rate.

2. The method of claim 1 wherein the act of scrubbing the memory cells in the DRAM device at a second rate comprises scrubbing the memory cells in the DRAM device at a rate that is a function of the temperature of the DRAM device.

3. The method of claim 1 wherein the act of scrubbing the memory cells in the DRAM device at a second rate comprises scrubbing the memory cells in the DRAM device at a rate that is initially a function of the temperature of the DRAM device and is thereafter adjusted as a function of the number of memory errors that are found to exist in a prior memory scrubbing procedure.

4. The method of claim 1 wherein the act of scrubbing the memory cells in the DRAM at a second rate comprises:
    sequentially scrubbing the memory cells from a first row to a last row of a memory array in the DRAM device; and
    after scrubbing the last row of the memory array, waiting for a delay period corresponding to the second rate before repeating the sequential scrubbing of the memory cells from the first row to the last row of the memory array in the DRAM device.

5. The method of claim 1 wherein the act of scrubbing the memory cells in the DRAM at a second rate comprises:
    sequentially scrubbing the memory cells from a first row to a last row of a memory array; and
    after scrubbing each row of memory cells, waiting for a delay period corresponding to the second rate before scrubbing another row of memory cells.

6. The method of claim 1 wherein the act of scrubbing the memory cells results in correcting any memory errors that may exist in the DRAM device, and wherein the act of scrubbing the memory cells in the DRAM device at a second rate comprises scrubbing the memory cells in the DRAM device at a rate that is a function of the number of memory errors that are found to exist in a prior memory scrubbing procedure.

7. The method of claim 6 wherein the act of scrubbing the memory cells in the DRAM device at a rate that is a function of the number of memory errors that are found to exist comprises:

increasing the rate if the number of memory errors is greater than a predetermined value; and decreasing the rate if the number of memory errors is less than a predetermined value.

8. The method of claim 1 wherein the act of scrubbing the memory cells in the DRAM device comprises:

reading data from the memory cells of the DRAM device;

reading check bits associated with the data from the DRAM device;

generating check bits from the read data;

generating a syndrome from the generated check bits and the read check bits; and in the event the syndrome indicates there is an error in the read data and/or check bits, generating corrected data and/or check bits, and writing the corrected data and/or check bits to the memory cells of the DRAM device.

9. The method of claim 8 wherein the act of writing the corrected data and/or check bits to the memory cells of the DRAM device comprises:

combining the corrected data and the check bits to provide a corrected ECC; and writing the corrected ECC to the DRAM device.

10. The method of claim 8 wherein the act of writing the corrected data and check bits to the memory cells of the DRAM device comprises:

writing the corrected data to a first location in the DRAM device; and writing the corrected check bits to a second location in the DRAM device that is separate from the first location.

11. A dynamic random access memory ("DRAM") device, comprising:

an array of memory cells arranged in rows and columns;

an addressing circuit receiving and decoding an external address;

a data path coupling data between a data bus and memory cells corresponding to the decoded memory address;

a command decoder receiving and decoding external memory commands, the command decoder generating control signals for controlling the operation of the DRAM device, the command decoder further causing the DRAM device to operate in either a normal mode or a power-saving mode;

a refresh controller operable to refresh the memory cells in the array at a first rate when the command decoder causes the DRAM device to operate in the normal mode; and a scrubbing controller operable to scrub the memory cells in the array at a second rate that is substantially less than the first rate when the command decoder causes the DRAM device to operate in the power-saving mode, the scrubbing controller further being operable to inhibit scrubbing of the memory cells when the command decoder causes the DRAM device to operate in the normal mode.

12. The memory device of claim 11 wherein the second rate at which the scrubbing controller is operable to scrub the memory cells in the array is a function of the temperature of the DRAM device.

13. The memory device of claim 11 wherein the scrubbing controller is operable to read data from the memory cells, read check bits associated with the data from the DRAM device, generate check bits from the read data, generate a syndrome from the generated check bits and the read check bits, and, in the event the syndrome indicates there is an error in the read data and/or check bits, generate corrected data and/or check bits and write the corrected data and/or check bits to the memory cells.

14. The memory device of claim 11 wherein the second rate at which the scrubbing controller is operable to scrub the memory cells in the array is a function of the number of memory errors that are found to exist in a prior memory scrubbing procedure.

15. The memory device of claim 14 wherein the scrubbing controller is operable to increase the rate if the number of memory errors is greater than a predetermined value, and to decrease the rate if the number of memory errors is less than a predetermined value.

* * * * *